United States Patent
Jannin et al.

(10) Patent No.: US 9,329,245 B2
(45) Date of Patent: May 3, 2016

(54) MRI COMPATIBLE METHOD AND DEVICE FOR RAPID DNP ON A SOLID STATE HYPERPOLARIZED SAMPLE MATERIAL

(75) Inventors: Sami Jannin, Bremblens (CH); Antonio Giuseppe Gianotti, Heidelberg (DE); Joost Lohman, Kenilworth (GB); Frank Engelke, Rheinstetten (DE); Roberto Melzi, Pavia (IT); Aurélien Bornet, Haute-Nendaz (CH); Geoffrey Bodenhausen, Paris (FR)

(73) Assignees: Bruker BioSpin AG, Faellanden (CH); Ecole Polytechnique Fédérale de Lausanne (EPFL), Lausanne (CH)

( * ) Notice: Subject to any disclaimer, the term of this patent is extended or adjusted under 35 U.S.C. 154(b) by 1047 days.

(21) Appl. No.: 13/443,903

(22) Filed: Apr. 11, 2012

(65) Prior Publication Data
US 2013/0274111 A1    Oct. 17, 2013

(51) Int. Cl.
| | | |
|---|---|---|
| G01R 33/62 | (2006.01) | |
| G01R 33/28 | (2006.01) | |
| G01R 33/46 | (2006.01) | |
| G01R 33/56 | (2006.01) | |

(52) U.S. Cl.
CPC .......... G01R 33/282 (2013.01); G01R 33/4608 (2013.01); G01R 33/5605 (2013.01); G01R 33/62 (2013.01)

(58) Field of Classification Search
USPC .......... 324/300–322; 600/407–435; 505/180; 429/9.363
See application file for complete search history.

(56) References Cited

U.S. PATENT DOCUMENTS

| | | | |
|---|---|---|---|
| 6,278,893 B1* | 8/2001 | Ardenkjær-Larsen et al. ............ 600/420 | |
| 6,466,814 B1* | 10/2002 | Ardenkjaer-Larsen et al. ............ 600/420 | |
| 7,372,274 B2* | 5/2008 | Ardenkjaer-Larsen | G01R 33/282 324/307 |
| 8,697,034 B2* | 4/2014 | Kovacs et al. ............ 424/9.363 | |
| 2004/0066193 A1* | 4/2004 | Ardenkjaer-Larsen | G01R 33/282 324/309 |
| 2008/0287774 A1* | 11/2008 | Katz-Brull .................. 600/414 | |
| 2010/0092396 A1* | 4/2010 | Kovacs et al. ............ 424/9.363 | |
| 2013/0274111 A1* | 10/2013 | Jannin et al. .................. 505/180 | |
| 2014/0091792 A1* | 4/2014 | Jannin et al. .................. 324/309 | |

OTHER PUBLICATIONS bragam, A. et al., "Principles of dynamic nuclear polarisation", Rep. Prog. Phys., 1978. 41(3):p. 395-467.

(Continued)

*Primary Examiner* — Melissa Koval
*Assistant Examiner* — Tiffany Fetzner
(74) *Attorney, Agent, or Firm* — Paul Vincent

(57) ABSTRACT

A method for producing hyperpolarized sample material for use in magnetic resonance investigations involves preparing a target material containing high γ nuclei with a short T1, a polarizing agent with a broad EPR line, and low γ nuclei with a long T1. The polarizing agent in the target material is irradiated with microwave radiation, wherein the target material is at a cryogenic temperature and exposed to a static magnetic field $B_0 \geq 4.0$ T, thus polarizing the high γ nuclei by DNP, and the polarization is transferred from the high γ nuclei to the low γ nuclei by Cross Polarization. A dissolved sample material is prepared containing the hyperpolarized low γ nuclei from the target material. Nuclei with a long longitudinal relaxation time T1 can thereby be quickly hyperpolarized to a high polarization level.

29 Claims, 10 Drawing Sheets

(56) References Cited

OTHER PUBLICATIONS

Ardenkjaer-Larsen J.H. et al., "Increase in signal-to-noise ratio of > 10,000 times in liquid-state NMR", Proc. Natl. Acad. Sci. USA, 2003. 100(18):p. 10158-10163.

Ardenkjaer-Larsen J.H. et al., "Dynamic Nuclear Polarization Polarizer for Sterile Use Intent", Nmr in Biomedicine, 2011. 24(8): p. 927-932.

Batel, M. et al., "A multi-sample 94 GHz dissolution dynamic-nuclear-polarization system", Journal of Magnetic Resonance, Jan. 2012, vol. 214, p. 166-174.

Hartmann, S.R. et al., "Nuclear Double Resonance in the Rotating Frame", Phys. Rev., 1962. 128(5): p. 2042.

Jannin, S. et al., "Low-temperature cross polarization in view of enhancing dissolution Dynamic Nuclear Polarization in NMR", Chemical Physics Letters, 2011. 517 (4-6): p. 234-236.

Linde, A.J.P. "Application of Cross Polarisation Techniques to Dynamic Nuclear Polarisation Dissolution Experiments", PhD thesis, Sir Peter Mansfield Resonance Centre, The University of Nottingham, Nov. 2009.

Jóhannesson, H. et al., "Dynamic Nuclear Polarization of [1-$^{13}$C]pyruvic acid at 4.6 tesla", Journal of Magnetic Resonance, 2009. 197, p. 167-175.

Jannin, S. et al., "A 140 GHz prepolarizer for dissolution dynamic nuclear polarization", The Journal of Chemical Physics, 2008. 128, 241102.

* cited by examiner

MRI COMPATIBLE METHOD AND DEVICE FOR RAPID DNP ON A SOLID STATE HYPERPOLARIZED SAMPLE MATERIAL

BACKGROUND OF THE INVENTION

The invention relates to a method for producing hyperpolarized sample material for use in an NMR (nuclear magnetic resonance) investigation, in particular for use in an in vivo MRI (magnetic resonance imaging) experiment.

NMR techniques may be applied to gather information about a sample or sample area in a gentle, non-destructive way; in particular, clinical investigations on living patients can be done non-invasively. However, NMR techniques are generally limited by low signal intensities.

One way to increase signal intensities is to apply hyperpolarization techniques. Here, nuclei in a sample are prepared with a polarization level higher than corresponding to the Boltzmann distribution at the sample's temperature, and the hyperpolarized nuclei undergo an NMR experiment.

An important hyperpolarization technique is dissolution DNP (dynamic nuclear polarization). In this technique, a polarizing agent (typically based on a radical) is irradiated with microwave radiation, and the electron spin polarization of the polarizing agent is transferred to suitable nuclei, such as $^{13}C$. $^{13}C$ is widely used as a nucleus to be investigated via dissolution DNP, since its longitudinal relaxation time $T_1$ is long enough to complete typical NMR experiments before the polarization has decayed. The DNP process takes place at a cryogenic temperature, and after the polarization transfer, the hyperpolarized nuclei are dissolved for the NMR experiment.

A drawback of dissolution DNP on $^{13}C$ or comparable nuclei with long $T_1$ times, however, are relatively long times to prepare a hyperpolarized sample. At typical conditions, with a magnetic field strength of about 3.35 T and at a temperature of about 1.5 K and using the most common trityl radical, polarization levels of about 30-35% may be obtained, but polarization times have been found to be on the order of one hour for $^{13}C$. This poses a severe limitation in clinical applications. Further, temperatures of about 1.5 K are difficult to obtain.

Trityl is a relatively expensive type of radical. It has been tried to replace the trityl radicals with cheaper radicals such as TEMPO; however this has led to considerably lower polarization levels in $^{13}C$ in DNP experiments.

A. J. P. Linde [17] proposed to combine a DNP technique, hyperpolarizing protons, with a Cross Polarization technique, transferring the polarization from the protons to $^{13}C$. The DNP was done at a static magnetic field of 3.35 T and at a temperature of 1.5 K, and applied TEMPO radicals as polarizing agent. In Linde's experiments, polarization levels of $^{13}C$ comparable to those he obtained in direct DNP on $^{13}C$ with trityl radicals were obtained in a few minutes. In order to improve his technique, Linde proposed to lower the temperature of the system to 1.2 K.

It is the object of the invention to provide an method by means of which nuclei with a long longitudinal relaxation time $T_1$ can be quickly hyperpolarized to a high polarization level.

SUMMARY OF THE INVENTION

This object is achieved, in accordance with the invention, by a method for producing hyperpolarized sample material for use in magnetic resonance investigations, with the following steps:

a) preparing a target material, containing
high γ nuclei ($N_{hg}$) having a gyromagnetic ratio $\gamma_{hg}$ with $|\gamma_{hg}/2\pi| \geq 40$ MHz/T,
a polarizing agent (Pa) and
low γ nuclei ($N_{lg}$) having a gyromagnetic ratio $\gamma_{lg}$ with $|\gamma_{lg}/2\pi| \leq 18$ MHz/T;
wherein the high γ nuclei ($N_{hg}$) have a short longitudinal relaxation time $T1_{hg}$ and the low γ nuclei ($N_{lg}$) have a long longitudinal relaxation time $T1_{lg}$ so that $T1_{hg} < T1_{lg}$, b) irradiating the polarizing agent (Pa) in the target material with microwave radiation, wherein the target material is exposed to a static magnetic field $B_0$, with $B_0 \geq 4.0$ T, wherein the target material is at a cryogenic temperature Tcr, so that the target material is solid, and wherein an EPR line of the polarizing agent (Pa) has a width $w_{Pa}$ wherein $w_{Pa} > \frac{1}{2}\omega_{hg}$, with $w_{Pa} = 2\sqrt{2\log 2} \cdot \sigma$, with $\sigma^2$ being the second moment of the EPR line, and with $\omega_{hg}$ being the Larmor frequency of the high γ nuclei ($N_{hg}$), thus polarizing the high γ nuclei ($N_{hg}$) by DNP, c) transferring the polarization from the high γ nuclei ($N_{hg}$) to the low γ nuclei ($N_{lg}$) by Cross Polarization, d) preparing a dissolved sample material from the target material, wherein the sample material contains the hyperpolarized low γ nuclei ($N_{lg}$).

In accordance with the invention, the hyperpolarization process is based on a combination of Dissolution DNP and Cross Polarization. The DNP process is adapted here to optimize a hyperpolarization not of the low γ nuclei (such as $^{13}C$) which are intended to be investigated by NMR later on, but of the high γ nuclei (such as $^1H$).

In particular, the polarizing agent for the DNP process is chosen with a broad EPR line, so that a high polarization level of the high γ nuclei can be achieved during the DNP process. The polarization agent is, on the other hand, in general not well suited for polarizing the low γ nuclei by DNP, however this is irrelevant for the inventive method.

Polarizing the high γ nuclei (such as $^1H$) by DNP is much faster than polarizing the low γ nuclei (such as $^{13}C$ or $^{15}N$) with DNP, even if optimum polarization agents were chosen for each type of nucleus, given that the further conditions (such as $B_0$, Tcr, microwave radiation intensity) are chosen identically. In particular, the gain in polarization build-up rate for a high γ spin ½ nucleus (with $\gamma_{hg}$) compared to a low γ spin ½ nucleus (with $\gamma_{lg}$) is in first approximation given by $(\gamma_{hg}/\gamma_{lg})^{3/2}$.

This time advantage is exploited by the invention. The inventors found out that this time advantage is so pronounced that considerably higher magnetic fields than proposed by Linde [17] may be used in a combined dissolution DNP and Cross Polarization technique. Accordingly, the present invention proposes to choose the static magnetic field $B_0$ equal to or larger than 4.0 Tesla.

When choosing a higher static magnetic field during the DNP process, the maximum achievable polarization level is significantly increased, so e.g. an improved signal to noise ratio or improved image contrast may be achieved in a subsequent magnetic resonance investigation.

On the other hand, with a higher static magnetic field, the build-up time for the polarization of the high γ nuclei is increased, too. However, this increase in build-up time is still small as compared to the time advantage of polarizing the high γ nuclei instead of polarizing the low γ nuclei by DNP.

At the field strengths proposed in accordance with the invention, a direct polarization of low γ nuclei by DNP would take too long to be useful, while polarization of high γ nuclei is still possible within reasonable time, such as within a few minutes.

Further, due to the relatively high static magnetic field $B_0$ applied during the DNP process, a higher temperature may be chosen, too, without degrading the maximum achievable polarization level (saturation level) of the high γ nuclei too much. The influences on the polarization build-up time and the maximum achievable polarization level of the high γ nuclei from a higher temperature and from a higher static magnetic field are opposed to each other. By means of a higher temperature as compared to 1.5 K used by Linde [17], such as 2.2 K or more, or even 4.2 K or more, the build-up time for the polarization of the high γ nuclei is reduced, while the maximum achievable polarization level is decreased. As a very advantageous side effect, the cooling of the target material is simplified when higher temperatures Tcr are applied. By combining a high static magnetic field $B_0$ of 4.0 T or more with a relatively high temperature Tcr>1.5 K during the DNP process, good polarization levels of the high γ nuclei may be obtained in a relatively short time at reduced apparatus expenses.

The hyperpolarized high γ nuclei are then exploited for polarizing the low γ nuclei by means of Cross Polarization. This constitutes a further step as compared to a direct polarization of the low γ nuclei by DNP. However, time for this additional step is much shorter (typically about one millisecond) than the time advantage resulting from doing the DNP on the high γ nuclei instead of low γ nuclei (typically about one hour).

The hyperpolarized low γ nuclei may, due to their relatively long longitudinal relaxation time, be conveniently used in a subsequent NMR investigation. In particular, $T_1$ is typically long enough to prepare a biocompatible solution containing the hyperpolarized low γ nuclei, and inject it into a living animal or human body. However, the hyperpolarized low γ nuclei may be used in non-medical NMR investigations, too, in particular wherein the dissolved sample material is transferred into a non-living object such as a sample vessel.

The low γ nuclei ($N_{lg}$) and the high γ nuclei ($N_{hg}$) may be contained in different molecules in the target material. Their longitudinal relaxation times $T_1$ may be compared in solution state at room temperature.

The cryogenic temperature Tcr during step b) is typically below 25 K, preferably below or equal to 4.2K. In step b), the microwave radiation irradiating the target material causes transfer of the electron polarization of the polarizing agent to the high γ nuclei ($N_{hg}$); the transfer mechanism (using a broad line polarizing agent) is predominantly thermal mixing, in accordance with the invention. During step b), the low γ nuclei ($N_{lg}$) are also polarized to some degree, but in general insufficient for further magnetic resonance investigation. The polarizing agent has a relatively broad EPR line width (in particular broader than the EPR line width of trityl, preferably having a width $w_{Pa}$ at least two times as large), to allow an efficient (and fast) polarization of the high γ nuclei (which would not be achievable with trityl). As polarization agent may act a molecule, metal ion or a lattice defect in a solid material that contains an unpaired electron or unpaired electrons. The microwave radiation typically saturates the electron Zeeman transitions in the polarizing agent.

Step c) involves irradiating the target material with RF pulses, wherein the target material is typically kept in a static magnetic field and at a cryogenic temperature preferably the same as in step b) but possibly different.

DNP=dynamic nuclear polarization; T=Tesla; Tcr=cryogenic temperature; EPR=electron paramagnetic resonance; K=Kelvin; RF=radio frequency.

In a preferred variant of the inventive method, the static magnetic field of step b) is chosen with $B_0 \geq 4.5$ T, preferably $B_0 \geq 6.7$ T. Further preferred is a static magnetic field strength $B_0 \geq 5.1$ T. Such field strengths allow particularly high polarizations levels of the high γ nuclei after DNP—and thus also of the low γ nuclei after Cross Polarization, or higher cryogenic temperatures Tcr of the target material during the DNP step may be compensated for.

Particularly preferred is a variant wherein the cryogenic temperature Tcr of step b) is chosen with Tcr≥2.2K, preferably ≥4.2 K. Working at or above the λ-point of $^4$He (at 2.2 K) or at or above the boiling point of $^4$He (at 4.2 K) at normal pressure can be done with relatively simple cooling devices. At or above 4.2 K, no constant pumping is required at all. Further, at higher temperatures, the build-up times for the polarization of the high γ nuclei is reduced.

Also preferred is a variant providing that the cryogenic temperature Tcr of step b) is chosen with Tcr≤10 K. This avoids reducing the maximum achievable polarization level of the high γ nuclei too much.

In an advantageous variant, the cryogenic temperature Tcr of step b) is chosen with Tcr<2.2 K, preferably Tcr≤1.4 K, most preferably Tcr≤1.2 K. Working at these comparably low temperatures increases the maximum achievable polarization level of the high γ nuclei.

Preferably, the high γ nuclei ($N_{hg}$) and the low γ nuclei ($N_{lg}$) are chosen such that $|\gamma_{hg}/\gamma_{lg}|>3$. With a higher ratio of the gyromagnetic ratios, a more pronounced hyperpolarization of the low γ nuclei can be achieved after the Cross Polarization step.

In a preferred variant, the high γ nuclei ($N_{hg}$) are $^1$H or $^{19}$F. $^1$H is rather common and can be found in numerous molecules, so enrichment or labelling can be dispensed with. Both types of nuclei are of particular value in practice. Note that $^1$H has a γ/2π of 42.6 MHz/T and $^{19}$F has 40.1 MHz/T.

Also preferred is a variant wherein the low γ nuclei ($N_{lg}$) are $^6$Li or $^{13}$C or $^{15}$N or $^{31}$P or $^{29}$Si or $^{89}$Y or $^{57}$Fe or $^{199}$Hg. Again, these nuclei are of particular value in practice, with $^6$Li particularly relevant in neurological brain studies, $^{13}$C and $^{15}$N and $^{31}$P throughout the entire biochemistry, and $^{89}$Y as a contrast agent. Note that $^{13}$C has a γ/2π of 10.7 MHz, $^{15}$N has −4.3 MHz/T and $^{31}$P has 17.2 MHz/T. Further ratios γ/2π are given in standard works of reference.

In a highly preferred variant of the inventive method, $w_{Pa} \geq \omega_{hg}$. In this case, polarization of the high γ nuclei by DNP is particularly efficient and fast.

Further preferred is a variant wherein the polarizing agent are nitroxyl radicals. Nitroxyl radicals show particularly broad EPR lines, allowing in particular a good access to $^1$H in the DNP step b).

In a particularly preferred variant, the polarizing agent are TEMPO or TEMPOL radicals. These radicals have shown good results in practice with $^1$H high γ nuclei. Tempo=(2,2,6,6-Tetramethylpiperidin-1-yl)oxyl; Tempol=4-Hydroxy-2,2,6,6-tetramethylpiperidine 1-oxyl.

A preferred variant provides that in step b), the polarizing agent is irradiated until the polarization level of the high γ nuclei ($N_{hg}$) has reached at least 75%, preferably at least 90%, most preferably at least 95%, of its maximum achievable polarization at said static magnetic field $B_0$, at said cryogenic temperature Tcr and at the applied microwave radiation. Then the easy polarization of the high γ nuclei is exploited to a high degree. Typically, the build-up of the polarization of the low γ nuclei is much slower than for high γ nuclei during the DNP step. While the high γ nuclei will be near their maximum achievable polarization at the end of step b), the low γ nuclei will, in general, be still far away from their maximum achievable polarization (such as below 50% of it). Anyway, the polarization level of the low γ nuclei will be, in general, insufficient for subsequent magnetic resonance investigations after step b). Once the polarization level of the high γ nuclei ($N_{hg}$) has reached the desired value (such as 75%, 90% or 95% of its maximum achievable polarization), step b) is typically promptly ended and step c) begins. Note that the maximum achievable polarization levels for the nuclei depend on the degree of saturation of the electron transitions in the polarization agent by means of the microwave irradiation, on $B_0$ and on Tcr.

In another advantageous variant, step b) takes 30 minutes or less, preferably 10 min or less, and more preferably 3 min or less. With the above times for step b), the high γ nuclei have typically reached or almost reached their maximum achievable polarization (which depends on the microwave saturation of the polarization agent, $B_0$ and Tcr), while the low γ nuclei have not, so the advantages of the invention are particularly prominent.

Further advantageous is a variant wherein the long longitudinal relaxation time $T1_{lg}$ of the low γ nuclei ($N_{lg}$) is 5 s or longer, preferably 10 s or longer, more preferably 30 s or longer, most preferably 60 s or longer. In this case, there is typically enough time to complete an NMR investigation on the low γ nuclei before their hyperpolarization has decayed again. Note that the values for the longitudinal relaxation times quoted are those in the liquid state at room temperature.

In an preferred variant, $T1_{hg} \leq \frac{1}{2} T1_{lg}$, preferably $T1_{hg} \leq \frac{1}{5} T1_{lg}$, most preferably $T1_{hg} \leq \frac{1}{10} T1_{lg}$. In these cases, the invention significantly prolongs the time available for an NMR investigation (and its preparation after the DNP step), as compared to an NMR investigation directly on the high γ nuclei.

In an advantageous variant, during step c), the target material is kept in the static magnetic field $B_0$ and at the cryogenic temperature Tcr of step b). In this variant, the target material (which is typically contained in a sample container) can be kept stationary over steps b) and c), which simplifies the handling of the target material or the sample container, respectively.

Alternatively, during step c), the target material is exposed to a static magnetic field lower than $B_0$ of step b), and/or the target material is at a cryogenic temperature higher than Tcr of step b). Typically, the field change and/or temperature change results from a movement of the target material (or its sample container, respectively) from a microwave enclosure to an RF coil (or RF coils) between steps b) and c). Here the microwave enclosure and the one or more RF coils can be spatially separated as desired, simplifying the experimental setup.

In another preferred variant, during step d), molecules containing the low γ nuclei ($N_{lg}$) undergo a chemical reaction. In this way, the method is not limited to the type of molecules containing the low γ nuclei as contained in the target material, but the NMR investigation may be done with derivatives of these molecules, too.

Particularly preferred is a variant wherein after step d), the dissolved sample material containing the hyperpolarized low γ nuclei ($N_{lg}$) undergoes a magnetic resonance investigation. By means of the inventive method, higher signal intensities may be obtained due to the hyperpolarization generated by the combined dissolution DNP and Cross Polarization.

In a further development of this variant, the magnetic resonance investigation is an MRI investigation, in particular of metabolic imaging type. In particular in metabolic imaging, a quick preparation of the sample material is required, so not to let a human or animal patient wait too long between single sample material preparations, so the advantages of the invention are immediately pronounced. MRI=magnetic resonance imaging.

In another further development, the magnetic resonance investigation is an MRS investigation, in particular a localized MRS investigation. Here the hyperpolarization achieved by means of the invention allows high resolution spectra with much improved sensitivity. MRS=magnetic resonance spectroscopy.

Also within the scope of the present invention is a combined dissolution DNP and Cross Polarization device, suitable for producing hyperpolarized sample material according to the inventive method described above, comprising
a superconducting magnet suitable for generating a static magnetic field $B_0$ with $B_0 \geq 4.0$ T,
a cryostat, containing a sample container for the target material,
a microwave enclosure, placed within the said cryostat and connected to a microwave source via a microwave conduit, wherein in the microwave enclosure the target material can be exposed to microwave radiation;
at least one RF coil, placed within the cryostat and connected to a Cross Polarization device via at least one RF lead, wherein by means of the at least one RF coil the target material can be exposed to RF radiation at the Larmor frequencies of the high γ nuclei ($N_{hg}$) and the low γ nuclei ($N_{lg}$);
a plurality of solvent conduits connecting the sample container with a dissolution device, wherein solvent can be supplied to and dissolved sample material can be removed from the sample container by means of the solvent conduits and controlled by the dissolution device.

By means of the inventive combined dissolution DNP and Cross Polarization device (also called "combined device"), a high level polarization of the low γ nuclei can be generated in a relatively short time. In accordance with the invention, the superconducting magnet generates the static magnetic field $B_0$ in its bore at least at the position of the sample container during step b), i.e. in the microwave enclosure, and the cryostat cools at least the sample container with the target material down to the cryogenic temperature Tcr in step b), with Tcr typically ≤10 K. Preferably, this position of the sample container of step b) is also within or at the at least one RF coil so that the sample container does not need to be moved between steps b) and c) (static sample container); alternatively, the sample container may be moved after step b), e.g. upwards to a warmer region exposed to less static magnetic field (movable sample container) for step c), to a position within or at the at least one RF coil. The cryostat may be a dedicated sample cryostat for cooling the target material only, or a global cryostat also cooling the superconducting magnet. Typically, there are at least two RF coils (for the two Larmor frequencies of the high γ nuclei and the low γ nuclei); note that one RF coil may do if it is a double tuned RF coil.

In an advantageous embodiment of the inventive combined device, the superconducting magnet is suitable for generating a static magnetic field $B_0$ with $B_0 \geq 4.5$ T, preferably $B_0 \geq 6.7$ T. Further preferred is $B_0 \geq 5.1$ T. The higher static magnetic fields allows higher polarization levels of the high γ nuclei after DNP (and thus also of the low γ nuclei after Cross Polarization), or can compensate for a higher cryogenic temperature Tcr.

Particularly preferred is an embodiment wherein the cryostat is designed for generating a cryogenic temperature Tcr≥2.2 K in the sample container in step b). A higher Tcr accelerates the build-up of the polarization of the high γ nuclei in the DNP step, and allows the use of a more simple cooling equipment.

In an advantageous further development of this embodiment, the cryostat is at atmospheric pressure and contains liquid helium to a level above the sample container and a lambda point refrigerator submersed in the liquid helium and connected to a pump, in particular a low capacity pump. This setup is particularly simple and proven in practice. Note that with a lambda point refrigerator, temperatures below 2.2 K are not obtainable. Only moderate amounts of helium need to be pumped. A typical low capacity pump pumps about 40 m³ per hour; a typical range for low capacity pumps is 20-45 m³ pumped volume per hour.

In another advantageous embodiment, the cryostat is designed for generating a cryogenic temperature $T_{cr} \geq 4.2$ K in the sample container in step b). This accelerates the build-up of the polarization in the DNP step even more, and further simplifies the cooling equipment.

Preferred is a further variant of this embodiment, wherein the cryostat is at atmospheric pressure and contains liquid helium to a level above the sample container. No helium has to be pumped here, so pumps can be completely dispensed with. Note that with a non-pumped 4.2 K cryostat, temperatures below 4.2 K are not obtainable.

In an alternative embodiment, the cryostat is designed for generating a cryogenic temperature $T_{cr} < 2.2$ K, preferably $\leq 1.4$ K, most preferably $\leq 1.2$ K in the sample container in step b). The low temperatures allow a very high polarization level of the high γ nuclei.

A preferred further development of this embodiment provides that the cryostat is connected to a pump, in particular a high capacity pump, via a pumping line so the cryostat is below atmospheric pressure and contains liquid helium to a level above the sample container. The reduced pressure within the cryostat lowers the boiling point of liquid helium. A typical high capacity pump pumps 50-500 m³ per hour.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Overview over the Invention

Figure 1:
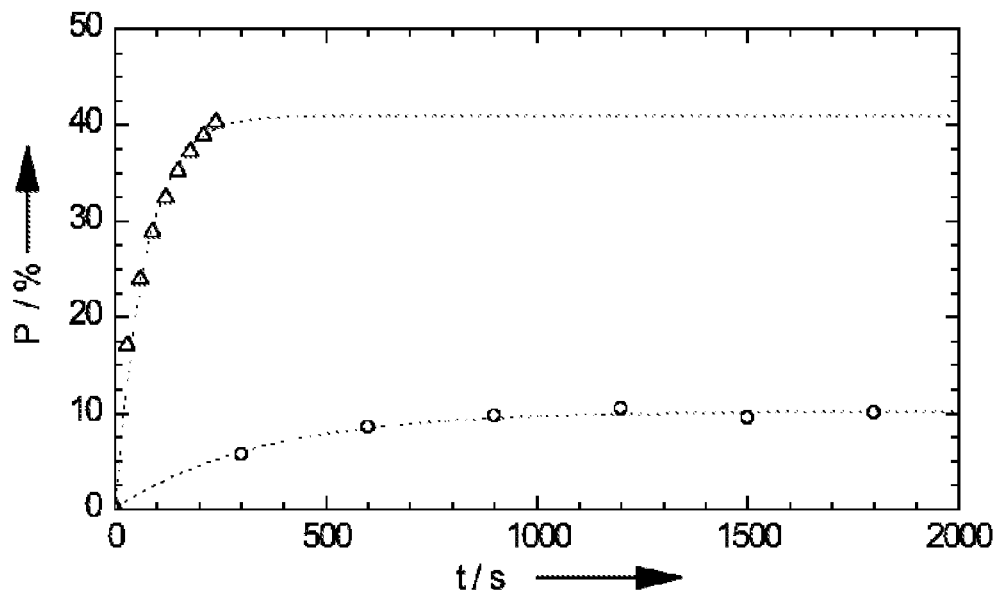
FIG. 1 is a diagram showing Carbon-13 (○) and proton (Δ) build-up behavior (polarization P versus time t) in $^{13}$C-labeled sodium acetate at 1.2K and 3.35 T with 35 mW microwave irradiation at 93.9 GHz.

The invention relates to a method and device for rapid Dynamic Nuclear Polarization (DNP). More specifically, the invention relates to a dissolution DNP combined with Cross Polarization (CP) in a high strength magnetic field.

In order to achieve efficient Dissolution DNP in NMR it has long been known that relaxation times $T_1$ of the investigated nucleus should be long enough to ensure a slow decay of polarization during the experiment time. $^{13}$C is one of the most used low γ nuclei in this field, and meets these relaxation requirements. In Dissolution DNP, $^{13}$C has been widely used as contrast agent and as metabolic tracer in preclinical and clinical applications.

The state of the art of Dissolution DNP of nuclei with long $T_1$ relies on the direct polarization of the nuclear spins through suitable radicals irradiated with microwaves at a temperature of 1.2 to 1.4 K and a field of 3.35 T. The selection of radicals with a narrow EPR line is crucial for the performance of the method. The well known Trityl radical meets the requirements [2] and has been preferred for high efficiency by scientists in the field. Typically polarization levels are obtained for solid state in the order of 30-35% for $^{13}$C. Even with the best suited radicals though, polarization times of nuclei with long $T_1$ ($^{13}$C for instance) can be extremely long, in the order of 2000 to 3000 seconds. This is seen as a severe limitation, in particular in clinical applications requiring multiple injections over short intervals.

Any attempt to change any of the above-mentioned parameters, except for lowering the temperature or increasing the magnetic field, has led to deterioration of the performance. Lowering the temperature to 1 K or less does elevate the level of polarization according to Boltzmann but is penalized by an increase in the polarization time and also by a higher LHe (liquid helium) consumption, and higher equipment costs. Similarly, increasing the magnetic field does indeed boost the polarization level but leads to prohibitively long build-up times. Thus, raising the field from 3.35 T to 4.6 T increases the polarization level $P(^{13}C)$ from ~35% to ~60% but requires a three times longer build-up time. Attempts to reduce the polarization time by adding a relaxation agent such as Gadolinium have been only partially effective because this also introduces an increased rate of loss of polarization and entails complications such as the toxicity of Gadolinium agents.

It is known that replacing Trityl by cheaper radicals such as TEMPO leads to a lower $^{13}C$ polarization levels $P(^{13}C)$. However, contrary to Trityl, TEMPO allows much faster build-up of the polarization of high γ nuclei such as $^1H$ or $^{19}F$ than for $^{13}C$. Even at much higher fields acceptable build-up times can be obtained.

The invention addresses the problems encountered so far in reducing the polarization time in Dissolution DNP. By selecting a radical suitable for the polarization of high γ nuclei and transferring their polarization to low γ nuclei with long $T_1$, high polarization levels of nuclei with long $T_1$ can be obtained in a relatively short time. This allows higher polarization levels to be reached at high field than could be previously obtained, while the polarization time is shortened. The invented method overcomes the severe drawbacks of direct polarization at high field and the elevated costs and complex operation at very low temperatures.

The invention proposes, in particular, a combination of the following conditions:

Using a radical with a broad EPR line such as TEMPO, allowing polarization of high γ nuclear spins ($^1H$, $^{19}F$, or others) efficiently and rapidly, even at high fields;

Polarizing a high γ nuclear spin with short $T_1$ ($^1H$, $^{19}F$, or others) in a first step;

Transferring the polarization by Cross Polarization from the high γ nucleus with short $T_1$ to the low γ nuclei with long $T_1$ of interest (for example $^{13}C$ or $^{15}N$) in a second step;

Operating at high fields such as 5 T, 7 T, or higher;

Being able to operate at a temperature Tcr>1.4K, preferably at 2.2 K or even more preferably at 4.2 K, still retaining sufficient levels of polarization.

Such an approach improves the technique, it provides:

Significant enhancement of the polarization of low-γ nuclei such as $^{13}C$. For example $P(^{13}C)$=25% with cross polarization from $^1H$ at 3.35 T and 1.2 K whereas it is only 10% at 3.35 T and 1.2 K without cross polarization.

Substantial gains in sample throughput (shorter repetition times) since one can exploit shorter build-up times of high γ nuclei. For example the build-up time is only 90 seconds at 3.35 T and 1.2 K instead of 600 s without cross polarization under the same conditions.

Higher polarization at higher fields while keeping a shorter build-up times. For example $P(^{13}C)$=70% at 6.7 T and 1.2 K with Cross Polarization and build-up time of less than 10 minutes.

The possibility to work at a higher temperature than 1.2 K (for example one can achieve the same polarization levels at 4.2 K as one can obtain with direct DNP at 1.2 K).

Introduction

Dissolution Dynamic Nuclear Polarization [1] (DNP) generally starts at low temperature (1.2-1.5 K) where low-γ nuclear spins with $S=\frac{1}{2}$ ($^{13}C$, $^{15}N$, $^{129}Xe$, $^{89}Y$, etc.) are polarized by microwave irradiation that saturates EPR transitions, followed by a dissolution step [2] wherein the DNP sample is rapidly dissolved and transported to a solution-state NMR or MRI system. This technique usually yields enhancements ε of NMR signals on the order of ε=10,000 with respect to the Boltzmann polarization at room temperature, provided that the highly polarized nuclear spins retain most of their polarization during dissolution and transfer.

Nuclear spins with high gyromagnetic ratios γ such as $^1H$ and $^{19}F$ tend to return rapidly to thermal equilibrium, so that, by the time the samples have arrived in the solution-state NMR or MRI system, the enhancements are usually modest. As a result, it is often not feasible to follow a chemical reaction or a metabolic process on the time scale of the lifetime of the hyper-polarization, which is limited by the spin-lattice relaxation time $T_1$. Recent NMR techniques have been developed to extend the lifetimes of hyperpolarized spins I with high gyromagnetic ratios $γ_I$ to longer timescales [3-6]. However, nuclear spins S with low gyromagnetic ratios $γ_S$ such as $^{13}C$ or $^{15}N$ are still much preferred in most dissolution DNP experiments.

It has been demonstrated that trityl radicals can be very efficient as polarizing agents for $^{13}C$ [7]. These carbon-centered radicals display ESR lines with narrow widths $Δv_e$, thus facilitating the direct build-up of $^{13}C$ polarization by thermal mixing (since $Δv_e > v_0(^{13}C)$) at moderate magnetic fields while leaving the $^1H$ spins close to their thermal equilibrium, since $Δv_e < v_0(^1H)$. The highest $^{13}C$ polarization [7] reported so far in a field $B_0$=3.35 T and at Tcr=1 K exceeds $P^{direct}(^{13}C)$= 35% with a build-up time constant $τ_{DNP}(^{13}C)$=2300 s resulting in a typical build-up time in excess of 1 hour. Although such high polarization levels can provide intense NMR signals after dissolution, the long DNP build-up times at 1 K do not allow one to perform several dissolution processes in rapid succession, as required for many in-vivo experiments with high throughput. When increasing the magnetic field to 4.6 T, it has been shown that polarization build-up times become dramatically long [18], and thus prohibitive for in-vivo applications. Two approaches, very different in essence, have been described recently to allow multiple in-vivo experiments at higher repetition rates: the design of multiple-sample DNP polarizers [8] and the use of cross-polarization [9, 10].

While the design of a sample changer in a restricted space at very low temperatures is a true technical challenge, the implementation of cross polarization (CP) appears more straightforward. Until recently, CP did not meet any interest, because a significant part of the DNP community focused on the use of trityl radicals that are efficient for nuclear spins with low gyromagnetic ratios γ like $^{13}C$, $^{15}N$, $^{129}Xe$, $^{89}Y$, etc, but not for protons.

On the other hand, the widely available and inexpensive radical TEMPO ((2,2,6,6-Tetramethylpiperidin-1-yl)oxyl) turns out to be the good option. Admittedly, the polarization levels that have been reported are modest compared to those achieved with trityl, typically $P^{direct}(^{13}C)$=10% with $τ_{DNP}$≈600 s in a field $B_0$=3.35 T at Tcr=1.5 K [11, 12]; at $B_0$=5 T, a $P^{direct}(^{13}C)$ of about 15% has been reported [19]. TEMPO has a broad inhomogeneous ESR line (also called EPR line), mainly broadened by g-anisotropy, and its linewidth at 1.2 K can exceed the $^1H$ Larmor frequency $v_0(^1H)$= 142.7 MHz at 3.35 T. These properties fulfill the conditions for $^1H$ DNP to occur preferably via thermal mixing (TM).

One of the main consequences, predicted theoretically [1] and observed experimentally [12], is that all nuclear spins with spin $S=\frac{1}{2}$ in the sample acquire a common spin temperature $T_S$.

ESR Features of Polarizing Agents

Excessively wide ESR (electron spin resonance) lines can be detrimental to the efficiency of DNP via thermal mixing (TM). This effect has been thoroughly described by Provotorov [13] in the high temperature approximation and by Borghini [14] at low temperatures, and experimental results have been obtained by Heckmann et al. [15]. Another unfavorable effect of wide ESR lines is due to the fact that nuclear spins I with high $\gamma_I$ become involved in the DNP process when thermal mixing (TM) is dominant. Nuclear spins with high $\gamma_I$ acquire an enhanced polarization, in part at the expense of the polarization of spins S with low $\gamma_S$. A 'leakage factor' was introduced in the Borghini theory by De Boer [16] to account for this phenomenon, which can simply be described by a loss of polarization via spin-lattice relaxation of the I spins.

Sample Properties Required for Cross-Polarization Combined with Dynamic Nuclear Polarization (CP-DNP)

Given that DNP with TEMPO takes place via thermal mixing (TM), a uniform spin temperature $T_S$ is only established after a certain interval. Once the 'DNP equilibrium' is reached, the polarizations of different nuclear spin species/ and S in the sample are simply proportional to their gyromagnetic ratios, provided that the high temperature approximation is applicable. Thus proton spins display the highest spin polarization amongst all nuclear spins except tritium. FIG. 1 presents DNP build-up curves for both $^{13}C$ and $^1H$. The DNP build-up time expressed as the corresponding time constant $\tau_{DNP}(^1H)=70$ s is shorter than $\tau_{DNP}(^{13}C)=324$ s by a factor $\kappa=4.6$. These two facts provide ample evidence of the utility of CP for DNP experiments when thermal mixing (TM) is the dominant mechanism, as occurs with TEMPO. As explained above, one has to carefully choose the degree of deuteration (resp. protonation) of the solvent in order to make CP efficient without significantly reducing the DNP efficiency. In many molecules, the presence of covalently attached protons in the neighborhood of the $^{13}C$ nuclei (separated by only two bonds in acetate) turns out to be sufficient for CP to be efficient.

In experiments presented here, the inventors chose 3M solutions of $^{13}C$ enriched sodium acetate with 30 mM TEMPO dissolved in a fully deuterated water:ethanol (67:33 v/v) mixture.

Methods for Dynamic Nuclear Polarization (DNP)

Figure 3:
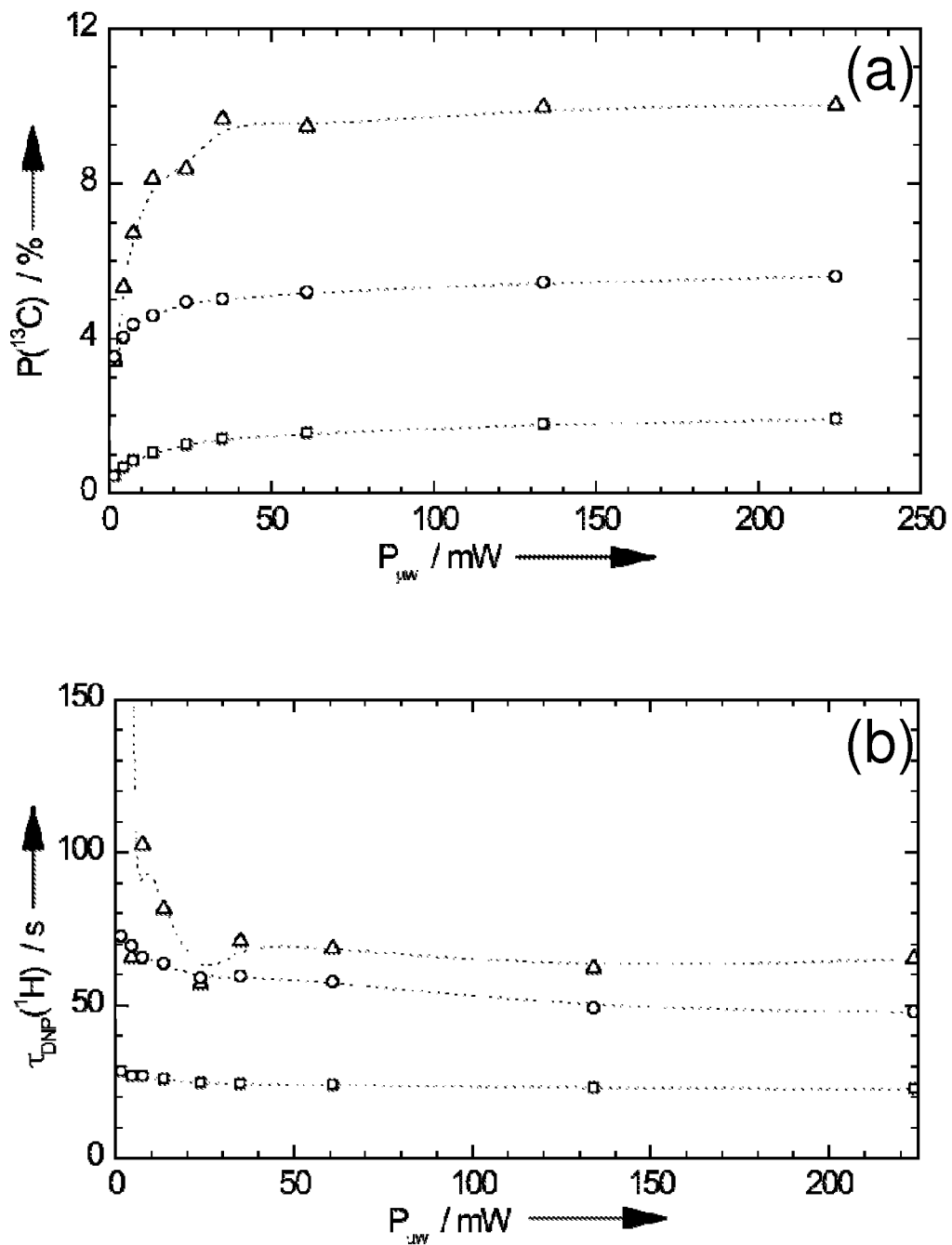
FIG. 3(a) $^{13}$C polarization P($^{13}$C) in $^{13}$C-labeled sodium acetate as a function of microwave power ($P_{\mu w}$) at 93.9 GHz and 3.35 T for $T_{cr}$=1.2 (Δ), 2.2 (○) and 4.2 (□) K. (b) Build-up times $\tau_{DNP}(^1H)$ at the same temperatures.

The inventor's home-built polarizer [11] operates at 3.35 T in the temperature range 1.2<T<4.2 K, with a tunable microwave source (ELVA) operating in CW mode in the power range 1.5<$P_{\mu w}$<225 mW. The dependence of the polarization on the microwave power is shown in FIG. 3 for different temperatures. Apart from Tcr=1.2 K, where maximum DNP could be achieved with a microwave power of merely $P_{\mu w}$=35 mW, the microwave source was set to its maximum output power $P_{\mu w}$=225 mW for all other experiments. The NMR signals were observed with a solid-state NMR spectrometer coupled to a home-built doubly tuned probe providing radiofrequency field (rf) amplitudes up to $\gamma B_1/(2\pi)$=50 kHz for both spins I and S (in our case at 142.6 MHz for $^1H$ and 35.87 MHz for $^{13}C$) with a moderate rf power less than $P_{rf}$=25 W on both channels.

Figure 2:
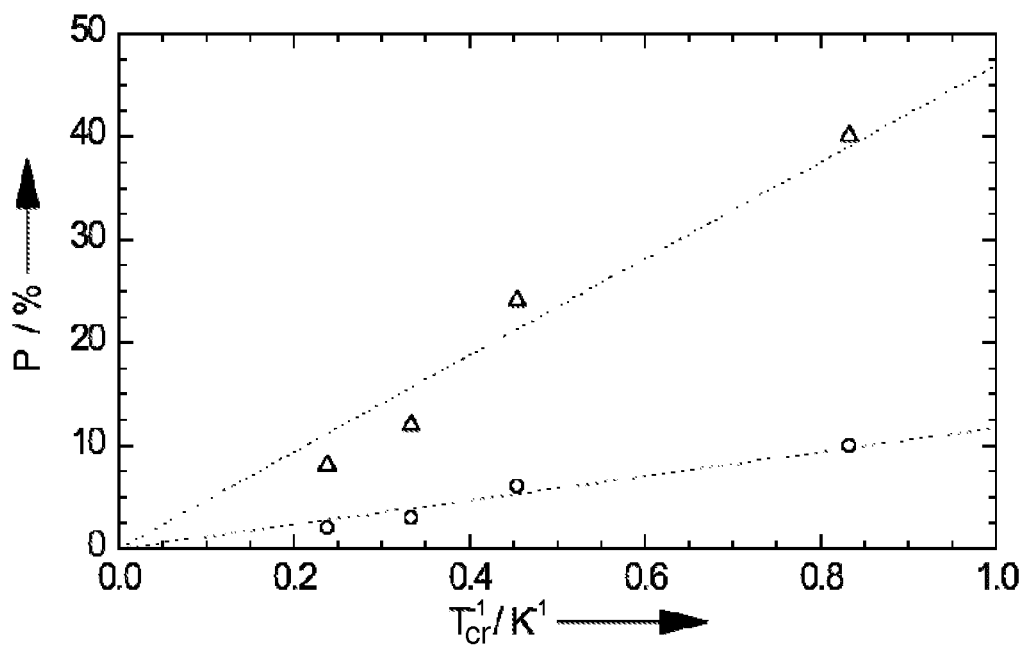
FIG. 2 is a diagram showing Carbon-13 (○) and proton (Δ) polarization P in $^{13}$C-labeled sodium acetate obtained in the range 1.2<$T_{cr}$<4.2 K without CP, plotted as a function of the inverse temperature $T_{cr}^{-1}$. The dashed lines are fits with $P=a/T_{cr}$ with a=11.7 for carbon-13 and a=46.9 for protons.

Table 1 (see below) presents the maximum achievable polarization levels $P(^{13}C)$ and $P(^1H)$ and the build-up times $\tau_{DNP}(^{13}C)$ and $\tau_{DNP}(^1H)$ obtained at different temperatures Tcr, with and without CP. FIG. 2 shows how the maximum polarization levels obtained at different temperatures Tcr are roughly inversely proportional to the temperature for both $^{13}C$ and $^1H$, as expected from spin temperature considerations [13, 14]. This is of special interest since, even at a comparatively high temperature of 4.2 K, nearly as much polarization $P(^1H, 4.2\ K)=8\%$ is available for protons as $P(^{13}C, 1.2\ K)=10\%$ for carbons-13 at 1.2 K.

TABLE 1

Polarizations $P(^{13}C)$ and $P(^1H)$ and corresponding build-up times $\tau_{DNP}(^{13}C)$ and $\tau_{DNP}(^1H)$ in $^{13}C$-labeled sodium acetate at Tcr = 1.2, 2.2, 3.0 and 4.2K.

| Tcr (K) | $P(^{13}C)$ | $T_{DNP}(^{13}C)$ | $P(^1H)$ | $T_{DNP}(^1H)$ |
|---|---|---|---|---|
| 1.2 | 10% | 324 s | 40% | 70 s |
| 2.2 | 6% | 267 s | 24% | 57 s |
| 3 | 3% | 222 s | 12% | 32 s |
| 4.2 | 2% | 158 s | 8% | 22 s |

As the temperature is increased, electron spin-lattice relaxation times always become shorter, regardless whether electron relaxation is dominated by direct or two-phonon Raman processes. This implies the need for a higher microwave power levels $P_{\mu w}$ to saturate the ESR line at higher temperatures:

FIG. 3a shows carbon-13 polarizations $P(^{13}C)$ obtained at different temperatures and different microwave power levels $P_{\mu w}$. Saturation can be easily achieved at Tcr=1.2 K with a modest microwave power ($P_{\mu w}\approx 30$ mW), but more power is required at higher temperatures. Although the build-up times $\tau$, see FIG. 3b, do not depend significantly on microwave power, they are dramatically accelerated at higher temperatures. The proton polarization build-up time is boosted by a factor $\kappa=\tau_{DNP}(1.2K)/\tau_{DNP}(4.2K)=3.2$.

Cross-Polarization Combined with Dynamic Nuclear Polarization (CP-DNP)

Figure 4:
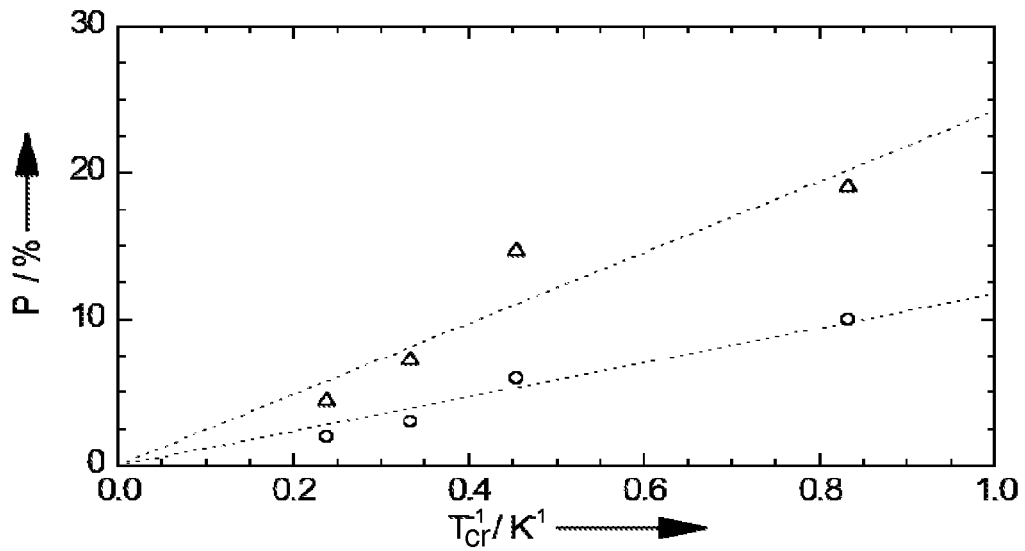
FIG. 4 Polarization levels $P^{CP}(^1H \rightarrow ^{13}C)$ and $P^{direct}(^{13}C)$ in $^{13}$C-labeled sodium acetate obtained with (Δ) and without (○) CP at 3.35 T in the temperature range 1.2<$T_{cr}$<4.2 K, plotted as a function of the inverse temperature $T_{cr}^{-1}$. The dashed lines represent linear fits with P=a/T with a=24.3 and 11.7 for carbon-13 with (Δ) and without (○) respectively.

The use of CP has the potential to increase the polarization from $P^{direct}(^{13}C)$ to $P^{CP}(^1H\rightarrow^{13}C)$, theoretically by a factor up to $\epsilon_{CP}=P^{CP}(^1H\rightarrow^{13}C)/P^{direct}(^{13}C)=\gamma(^1H)/\gamma(^{13}C)\approx 4$ at 1.2 K, to a maximum absolute polarization $P^{CP}(^{13}C)=40\%$ at 3.35 T. On the other hand, the use of CP allows one to obtain similar performances at 4.2 K as compared to direct DNP at 1.2 K, thus allowing the cryogenic equipment to be greatly simplified and easier to handle. Table 2 (see below) and FIG. 4 show polarization levels $P^{CP}(^{13}C)$ and $P^{direct}(^{13}C)$ that can be compared with those presented in Table 1. CP can provide an enhancement $\epsilon_{CP}>2$ compared to conventional direct DNP. However, further improvement in coil design (better $B_1$ homogeneity and arching tolerance) and spectrometer capabilities (faster switching times of rf phase and power) should lead to higher enhancement factors (theoretically up to $\epsilon_{CP}=4$). Another great advantage of CP under these conditions is the acceleration factor $\kappa_{CP}=\tau_{DNP}(^{13}C)/\tau_{DNP}(^1H)$, since polarization arises from the rapidly polarized protons. The efficiency of CP strongly relies on the amplitudes of the rf fields, which should ideally be larger than the NMR linewidths. In static samples at low temperatures, the main limitation arises from the breadth of the $^1H$ spectrum, which is typically on the order of 30-60 kHz.

TABLE 2

$^{13}C$ polarization in $^{13}C$-labeled sodium acetate obtained after CP at 3.35 T in the range $1.2 \le Tcr \le 4.2K$.

| Tcr (K) | $P^{CP}(^{13}C)$ | $\epsilon_{CP}$ | K |
|---|---|---|---|
| 1.2 | 19% | 1.9 | 4.6 |
| 2.2 | 14.6% | 2.4 | 4.7 |

TABLE 2-continued $^{13}$C polarization in $^{13}$C-labeled sodium acetate obtained after CP at 3.35 T in the range 1.2 ≤ Tcr ≤ 4.2K.

| Tcr (K) | $P^{CP}(^{13}C)$ | $\epsilon_{CP}$ | K |
|---|---|---|---|
| 3 | 7.2% | 2.4 | 6.9 |
| 4.2 | 4.4% | 2.2 | 7.2 |

High-Field DNP with TEMPO Combined with Cross Polarization

Figure 5:
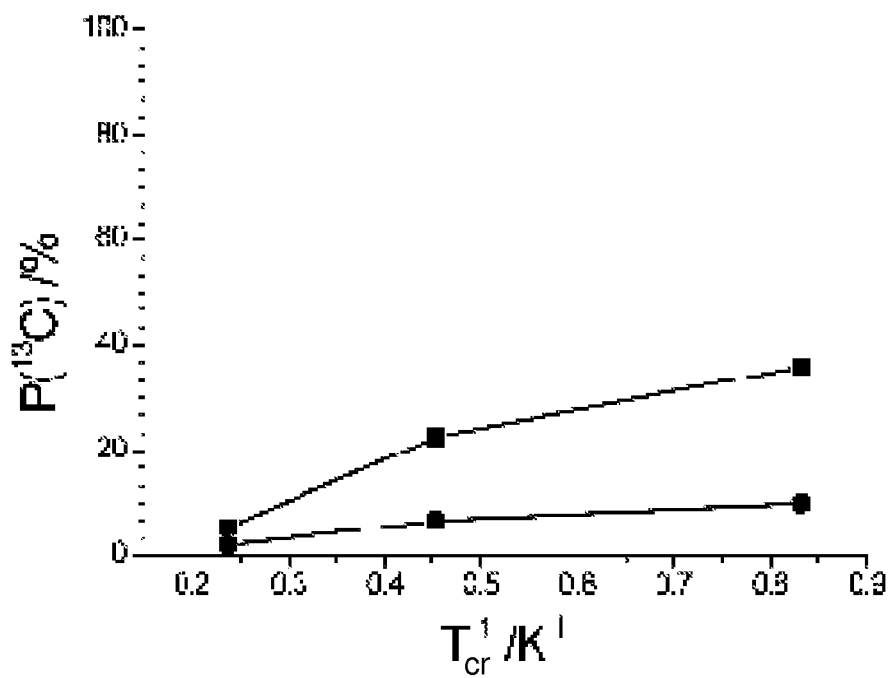
FIG. 5 Polarization P($^{13}$C) obtained at different temperatures $T_{cr}$ between 1.2 and 4.2 K, plotted as a function of the inverse temperature $T_{cr}^{-1}$, in a field of 3.35 T (●) and 6.7 T (■)
Figure 6:
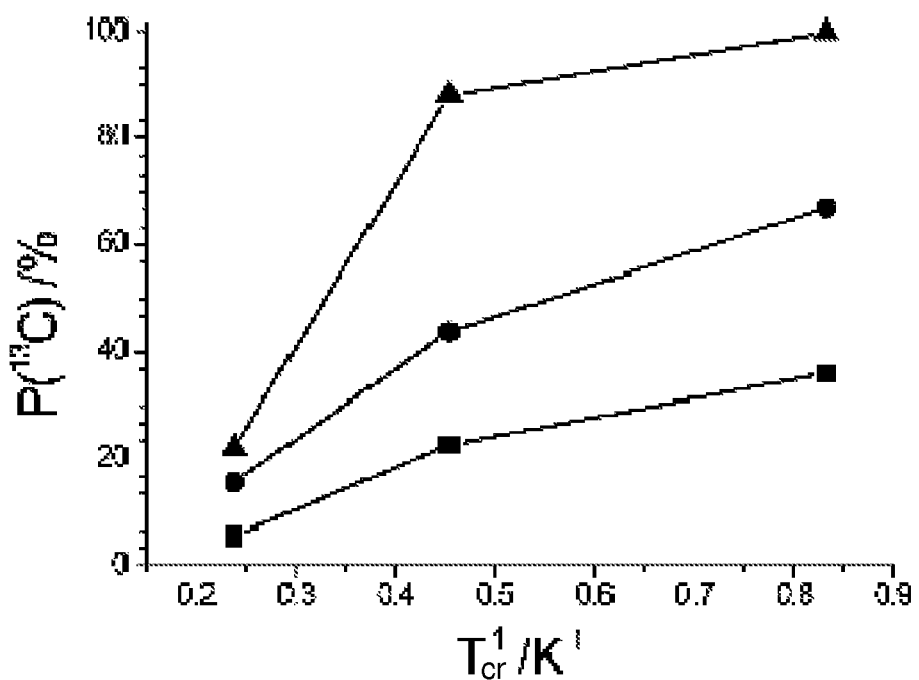
FIG. 6 (■) P($^{13}$C) obtained at different temperatures $T_{cr}$ between 1.2 and 4.2 K, plotted as a function of the inverse temperature $T_{cr}^{-1}$, in a field of 6.7 T by direct $^{13}$C polarization with TEMPO; (●) $^{13}$C polarization after Cross Polarization from $^1$H; (▲) Theoretical maximum P($^{13}$C) that could be obtained with ideal Cross Polarization efficiency; this shows the scope for potential improvements.
Figure 7:
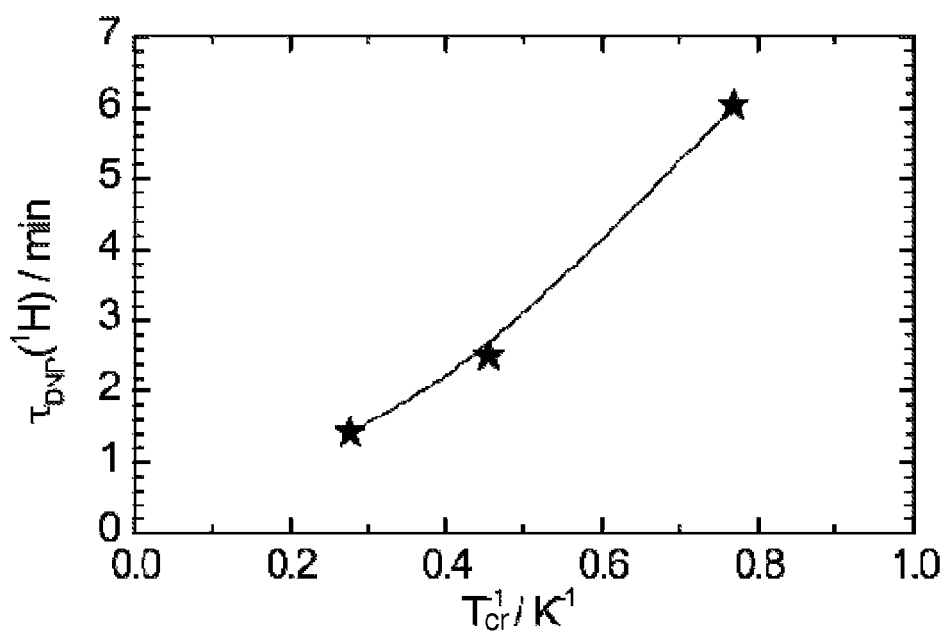
FIG. 7 Build-up times $\tau_{DNP}$ of $^1$H polarization at 6.7 T at different temperatures $T_{cr}$, plotted as a function of the inverse temperature $T_{cr}^{-1}$; by applying Cross Polarization, $^{13}$C polarization can be obtained at the same time scale.

The use of TEMPO for DNP instead of Trityl allows one to work at higher fields (6.7 T for example) to obtain higher polarization levels. FIG. 5 shows the net improvement of DNP at 6.7 T if compared to 3.35 T for different temperatures. FIG. 6 shows the improvements obtained by combination with CP, which allow one to obtain up to 70% polarization for $^{13}$C at 1.2 K and 6.7 T. FIG. 7 finally illustrates the time in which $^{13}$C polarization can be achieved as a function of temperature with CP at 6.7 T. Even at very low temperatures, the build-up time remains short, typically about 6 minutes.

Conclusions

High field DNP of high γ nuclear spins with cheap radicals such as TEMPO combined with Cross-polarization is a method of choice for dissolution DNP experiments. It provides significant enhancements with respect to direct polarization of low-γ nuclei such as $^{13}$C, and substantial gains in build-up times.

Inventive Combined Devices

Figure 8:
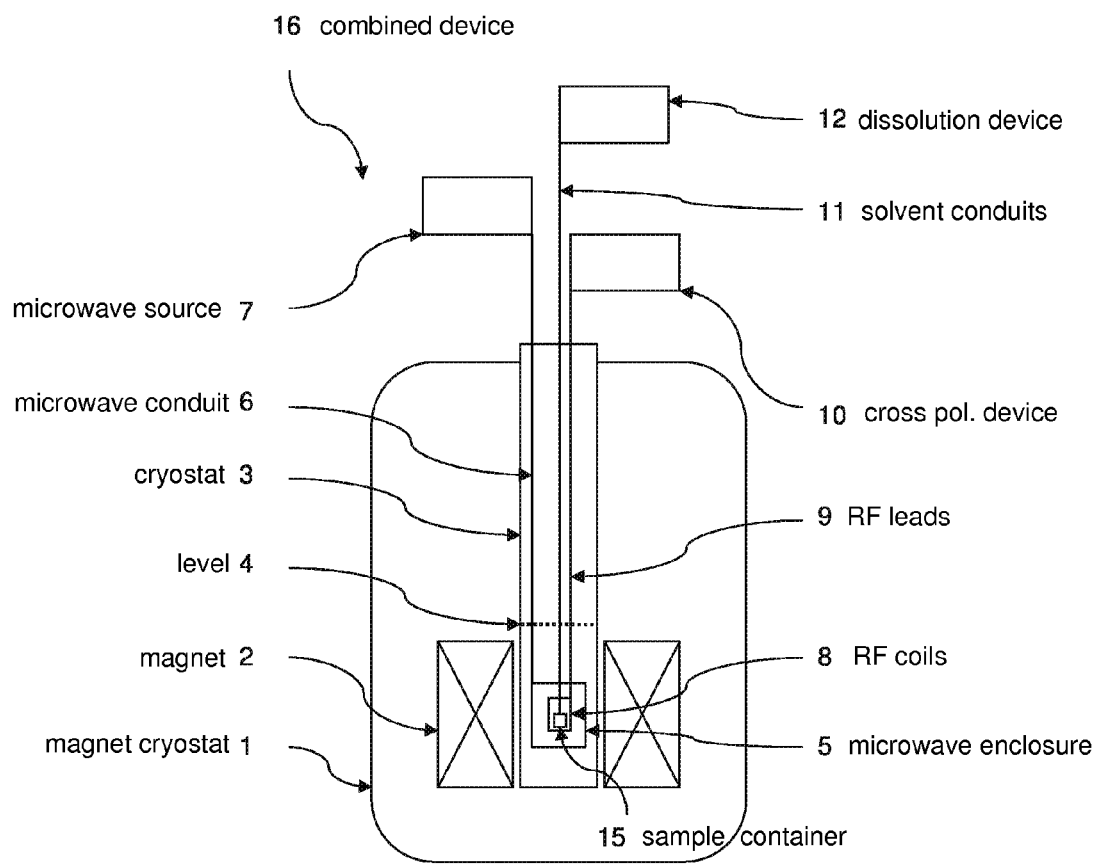
FIG. 8 a schematic cross-sectional view of an first embodiment of an inventive combined dissolution DNP and Cross Polarization device, operating at 4.2 K without pumping.

FIG. 8 illustrates in a schematic, cross-sectional view a combined dissolution DNP and Cross Polarization device 16 ("combined device") for use in an inventive method by way of example.

The combined device 16 comprises a superconducting magnet 2, here contained in a magnet cryostat 1 for keeping the superconducting magnet 2 below its critical temperature. The superconducting magnet 2 has a bore into which reaches a cryostat 3, here a sample cryostat independent of the magnet cryostat 1. The cryostat 3 is filled with liquid helium up to a level 4.

At a center region within the bore of the superconducting magnet 2, within the cryostat 3, there is arranged a sample container 15 housing a target material. The target material contains a polarizing agent (e.g. TEMPO radicals) and molecules comprising high γ nuclei (e.g. $^{1}$H) and low γ nuclei (e.g. $^{13}$C). The sample container 15 is in a position below the liquid helium level 4, so it can be kept at a temperature Tcr of about 4.2 K, at which it is solid. At the position of the sample container 15, the superconducting magnet 2 provides a static magnetic field $B_0$ of 4.0 Tesla or more, e.g. of 6.7 Tesla, preferably with a high homogeneity.

The sample container 15 is arranged within a microwave enclosure 5, which is in turn connected to a microwave source 7 via a microwave conduit 6. Within the microwave enclosure 5, the target material within the sample container 15 can be irradiated with microwave radiation, in order to perform step b) of the inventive method. By means of the microwave radiation, the high γ nuclei can be polarized.

Further, the sample container 15 is arranged within RF coils 8 (only side contours of which are visible in FIG. 8) here. The RF coils 8 are connected to a Cross Polarization device 10 via RF leads 9. By means of the RF coils 8, the target material within the sample container 15 can be exposed to RF pulses at the Larmor frequencies of both the high γ nuclei and the low γ nuclei (at the magnetic field strength $B_0$), in order to perform step c) of the inventive method. Note that a double tuned RF coil may be used instead of RF coils 8 here, if desired. By means of the RF pulses, polarization can be transferred from the high γ nuclei to the low γ nuclei.

By means of solvent conduits 11 (only one of which is shown in FIG. 8, for simplification), a solvent can be pumped into the sample container 15, in order to dissolve the target material contained therein, and the dissolved target material can be pumped out of the bore. Note that for facilitating the dissolution of the target material, the solvent conduits and/or the sample container may be equipped with a heating, e.g. an ohmic heating. The dissolution process is controlled by a dissolution device 12.

From the dissolved target material, a dissolved sample material can be prepared and used in a magnetic resonance investigation then, using the only slowly decaying hyperpolarization of the low γ nuclei contained therein. Note that in some cases, the dissolved target material may directly act as the dissolved sample material.

Figure 9:
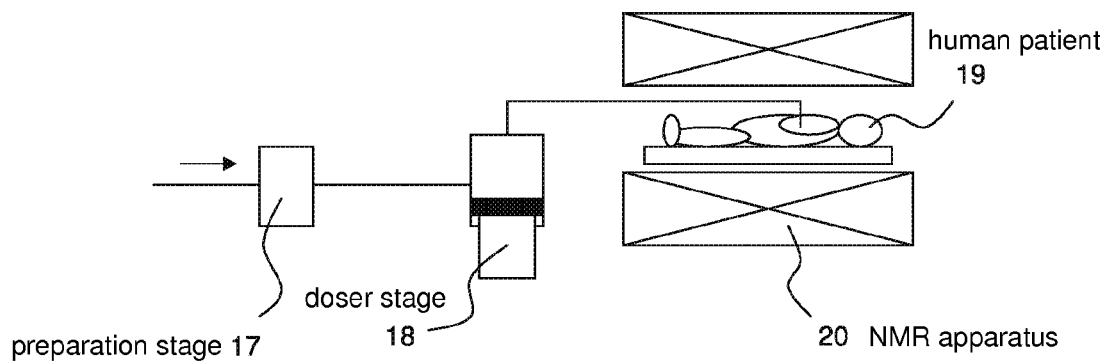
FIG. 9 a schematic view of an experimental setup for a magnetic resonance investigation, in accordance with the invention.

For the magnetic resonance investigation, a further NMR apparatus may be used, compare FIG. 9 for an example of this.

In accordance with the invention, in order to prepare a dissolved sample material, the dissolved target material removed from the sample container undergoes a treatment at a preparation stage 17, which removes undesired (e.g. toxic) parts from the dissolved target material, so a biocompatible solution results. The preparation stage may include in particular a filter. The dissolved sample material is then pumped into a doser stage 18 here, which controls an injection of the sample material into a human patient 19. By means of an NMR apparatus 20, here an MRI device, the low γ nuclei contained in the sample material may be used in the course of a metabolic imaging of the patient 19.

Figure 10:
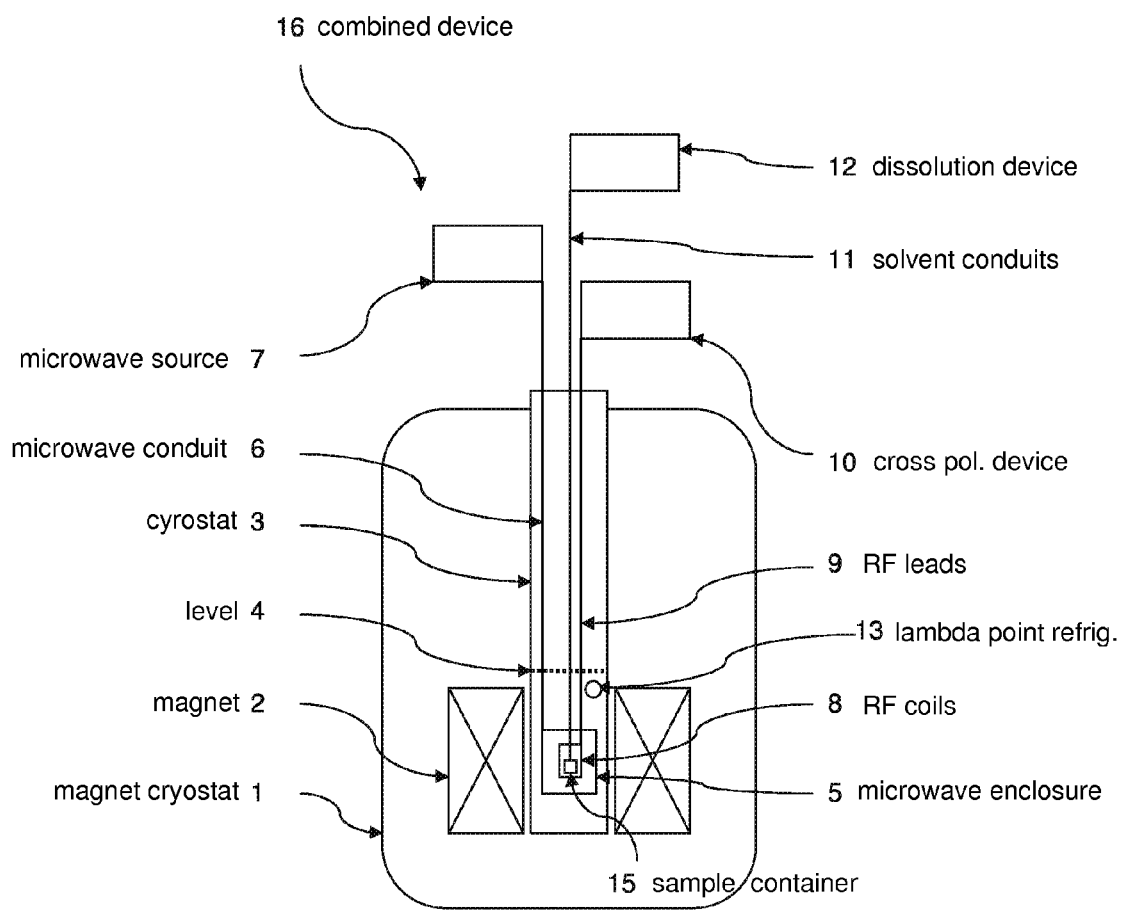
FIG. 10 a schematic cross-sectional view of a second embodiment of an inventive combined device similar to the one shown in FIG. 8, operating at 2.2 K with a lambda point refrigerator.

FIG. 10 illustrates another embodiment of a combined device 16, similar to the combined device shown in FIG. 8. Only the differences are discussed for simplification.

In the combined device 16 of FIG. 10, the cryostat 3 is equipped with a lambda point refrigerator 13, submersed in the liquid helium within the cryostat 3, and connected to a low capacity pump (not shown, for simplification). By this means, a temperature of 2.2 K can be established at the sample container 15.

Figure 11:
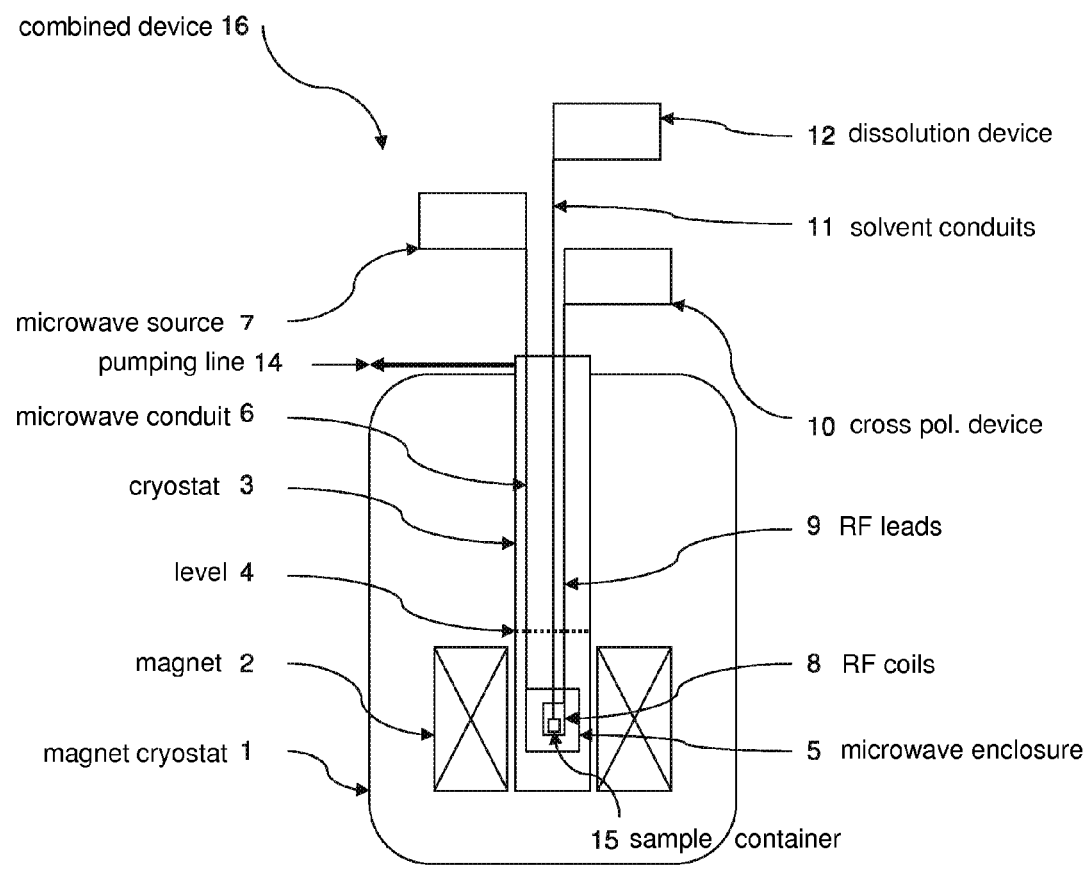
FIG. 11 a schematic cross-sectional view of a third embodiment of an inventive combined device similar to the one shown in FIG. 8, operating at 1.5 K with a continuously pumped cryostat.

FIG. 11 illustrates yet another embodiment of a combined device 16, similar to the combined device shown in FIG. 8. Only the differences are discussed for simplification.

In the combined device 16 of FIG. 11, the cryostat 3 is connected to a high capacity pumping line 14 above the liquid helium level 4. The pumping line 14 is connected to a high capacity pump (not shown for simplification). Thus a pressure below atmospheric pressure may be established within the cryostat 3. By this means, a temperature below 2.2 K, e.g. 1.5 K or lower, can be established at the sample container 15.

Figure 12:
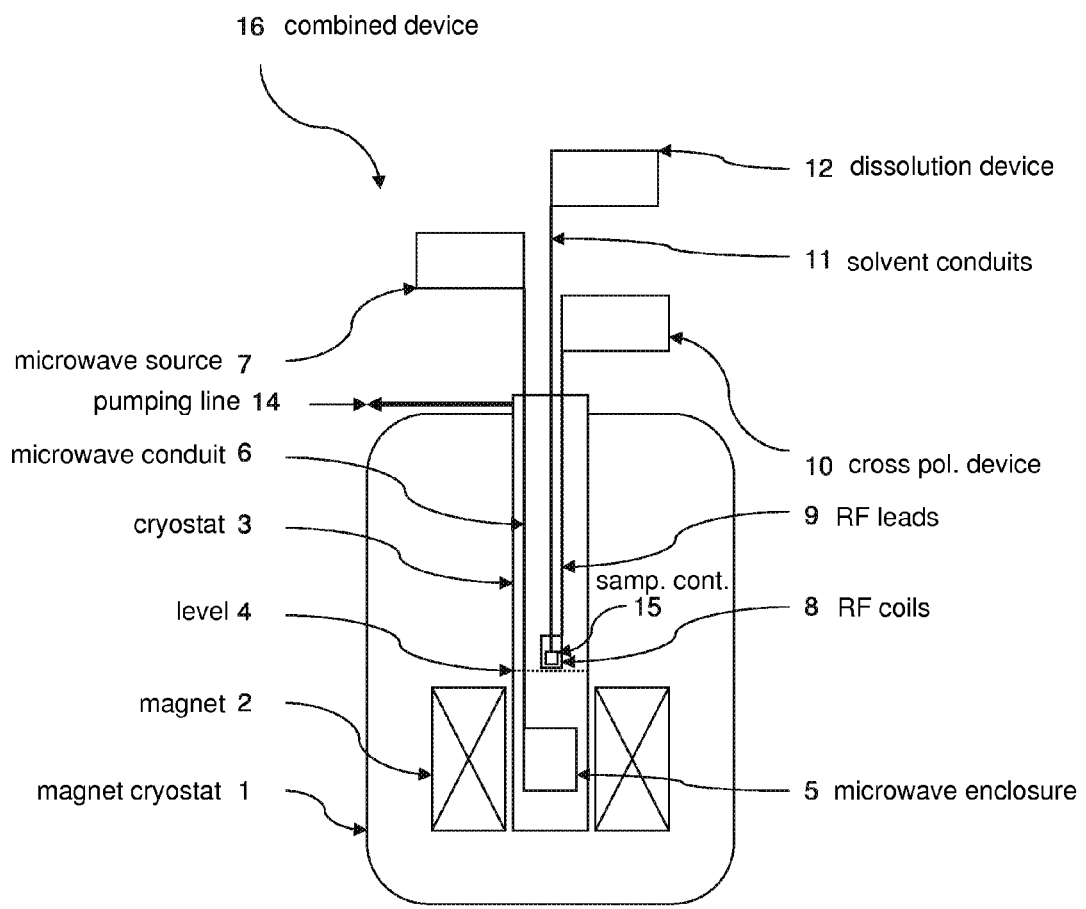
FIG. 12 a schematic cross-sectional view of a forth embodiment of an inventive combined device similar to the one shown in FIG. 11, with a movable sample container.

FIG. 12 illustrates another embodiment of device 16, similar to the combined device shown in FIG. 11. Only the differences are discussed for simplification.

The combined device 16 of FIG. 12 allows the target material in sample container 15 during step c) to be exposed to a static magnetic field lower than $B_0$ of step b), and to a cryogenic temperature higher than Tcr of step b). In the illustrated embodiment, the field change and temperature change result from a movement of sample container 15 from microwave enclosure 5 to the RF coils 8 between steps b) and c) by sample translation means, for example, a moveable sample stick (not shown). The RF coils 8 are positioned in a magnetic field lower than $B_0$ above the magnetic center of the superconducting magnet 2 (which is roughly at the center of the microwave enclosure 5 here), and at a temperature higher than Tcr above the liquid helium level 4.

Note that a moveable sample container may also be applied with combined devices operating at higher cryogenic temperatures, as shown in FIGS. 8 and 10.

Figure 13:
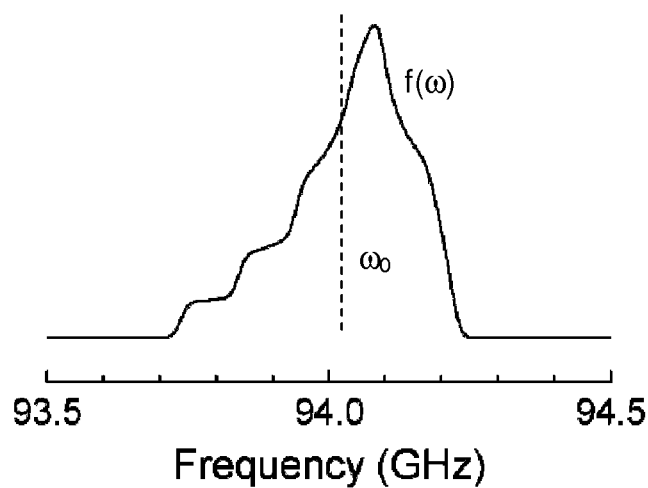
FIG. 13 a diagram illustrating the EPR absorption line of TEMPO at 1.5 K and 3.35 T.

FIG. 13 illustrates an EPR line of a polarizing agent. In the figure, the theoretical EPR absorption line shape for TEMPO at 1.2 K and at 3.35 T is illustrated.

The invention proposes to apply a polarizing agent with a sufficiently broad EPR line so the high γ nuclei (such as $^1H$) may be efficiently polarized by DNP. Note that in general, the high γ nuclei are more abundant than the low γ nuclei in the target material, with a concentration $c_{hg}$ of the high γ nuclei typically being at least twice, in particular at least ten times, as large as the concentration $c_{lg}$ of the low γ nuclei.

In accordance with the invention, the width $w_{pa}$ of an EPR line is larger than half the Larmor frequency $\omega_{hg}$ of the high γ nuclei (at $B_0$ in step b)), i.e. $w_{Pa} > \frac{1}{2}\omega_{hg}$, and preferably $w_{Pa} \geq \omega_{hg}$. The width of an EPR line can conveniently be characterised by the square root of its second moment $\sigma^2$. With the EPR absorption line shape defined by the normalised function $f(\omega)$ with dimension $1/\omega$, such that $\int f(\omega)d\omega = 1$, the second moment is given by $\sigma^2 = \int(\omega-\omega_0)^2 f(\omega)d\omega$, wherein $\omega$ is the variable frequency and $\omega_0$ is the center of the EPR line defined by $\int(\omega-\omega_0)f(\omega)d\omega = 0$. The width $w_{Pa}$ is then defined as $w_{Pa} = 2\sqrt{2\log2} \cdot \sigma \approx 2.3548 \cdot \sigma$.

For instance, a Gaussian line shape is described by $$f(\omega) = \frac{1}{\tilde{\sigma}\sqrt{2\pi}} \exp\left(\frac{-\omega(\omega-\omega_0)^2}{2\tilde{\sigma}^2}\right).$$

It is easily verified that, for this example, the square root of the second moment equals $\tilde{\sigma}$, whereas $w_{Pa} = 2\sqrt{2\log2} \cdot \tilde{\sigma}$ is the Full Width at Half Maximum (FWHM).

Figure 14:
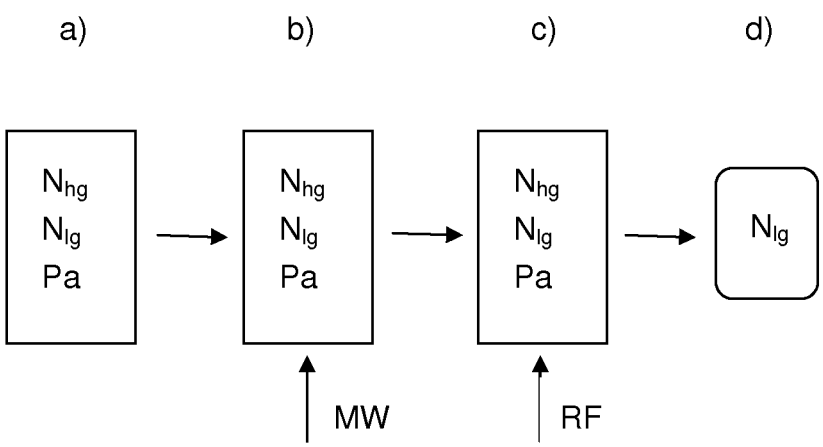
FIG. 14 a schematic flow diagram of the inventive method.

FIG. 14 illustrates in a schematic flow diagram the steps of the inventive method for producing hyperpolarized nuclei, by way of example. In a step a), a target material comprising high γ nuclei $N_{hg}$, low γ nuclei $N_{lg}$ and a polarizing agent Pa is prepared, e.g. by mixing corresponding molecules in a suitable solvent. In a step b), at a high static magnetic field $B_0$ of at least 4 Tesla and at a cryogenic temperature Tcr of e.g. 4.2 K, with the target material frozen, microwave radiation MW is directed to the target material, and high γ nuclei are polarized by means of DNP. In step c), typically at the same static magnetic field and at the same temperature as in step b), RF pulses are directed to the target material, and polarization is transferred from the high γ nuclei $N_{hg}$ to the low γ nuclei $N_{lg}$ by means of Cross Polarization. Then in a step d), a dissolved sample material is prepared from the target material. The dissolved sample material only needs to comprise polarized low γ nuclei $N_{lg}$, as prepared in step c) before. The dissolved sample material may be used in an NMR investigation, as illustrated in FIG. 9.

In summary, a method for producing hyperpolarized sample material for use in magnetic resonance investigations is presented, with
a) preparing a target material, containing
   high γ nuclei with a short T1,
   a polarizing agent with a broad EPR line, and
   low γ nuclei with a long T1,
b) irradiating the polarizing agent in the target material with microwave radiation, wherein the target material is at a cryogenic temperature and exposed to a static magnetic field $B_0 \geq 4.0$ T, thus polarizing the high γ nuclei by DNP,
c) transferring the polarization from the high γ nuclei to the low γ nuclei by Cross Polarization,
d) preparing a dissolved sample material containing the hyperpolarized low γ nuclei from the target material. With the inventive method, nuclei with a long longitudinal relaxation time T1 can be quickly hyperpolarized to a high polarization level.

REFERENCES

1. Abragam, A. and M. Goldman, Principles of Dynamic Nuclear-Polarization. Rep. Prog. Phys., 1978. 41(3): p. 395-467.
2. Ardenkjaer-Larsen, J. H., et al., Increase in signal-to-noise ratio of >10,000 times in liquid-state NMR. Proc. Natl. Acad. Sci. USA, 2003. 100(18): p. 10158-10163.
3. Carravetta, M., O. G. Johannessen, and M. H. Levitt, Beyond the T-1 limit: singlet nuclear spin states in low magnetic fields. Phys. Rev. Lett., 2004. 92(15): p. 153003-153007.
4. Ahuja, P., et al., Proton hyperpolarisation preserved in long-lived states. Chem. Comm., 2010. 46(43): p. 8192-8194.
5. Bornet, A., S. Jannin, and G. Bodenhausen, Three-field NMR to preserve hyperpolarized proton magnetization as long-lived states in moderate magnetic fields. Chem. Phys. Lett. In Press.
6. Vasos, P. R., et al., Long-lived states to sustain hyperpolarized magnetization. Proc. Natl. Acad. Sci. USA, 2009. 106(44): p. 18475-18479.
7. Ardenkjaer-Larsen, J. H., et al., Dynamic Nuclear Polarization Polarizer for Sterile Use Intent. Nmr in Biomedicine, 2011. 24(8): p. 927-932.
8. Batel, M., et al., A multi-sample 94 GHz dissolution dynamic-nuclear-polarization system. Journal of Magnetic Resonance, January 2012, Volume 214, p. 166-174.
9. Hartmann, S. R. and E. L. Hahn, Nuclear Double Resonance in the Rotating Frame. Phys. Rev., 1962. 128(5): p. 2042.
10. Jannin, S., et al., Low-temperature cross polarization in view of enhancing dissolution Dynamic Nuclear Polarization in NMR. Chemical Physics Letters, 2011. 517(4-6): p. 234-236.
11. Comment, A., et al., Design and performance of a DNP prepolarizer coupled to a rodent MRI scanner. Concepts Magn. Reson. Part B, 2007. 31B(4): p. 255-269.
12. Kurdzesau, F., et al., Dynamic nuclear polarization of small labelled molecules in frozen water-alcohol solutions. J. Phys. D, 2008. 41(15): p. 155506.
13. Kozhushner, M. A. and B. N. Provotorov, On the Theory of Dynamic Nuclear Polarization in Crystals. Soviet Physics-Solid State, 1964. 6(5): p. 1152-1154.
14. Borghini, M., Spin-Temperature Model of Nuclear Dynamic Polarization Using Free Radicals. Physical Review Letters, 1968. 20(9): p. 419-&.
15. Heckmann, J., et al., Electron spin resonance and its implication on the maximum nuclear polarization of deuterated solid target materials. Physical Review B, 2006. 74(13).
16. Boer, W., et al., Dynamic polarization of protons, deuterons, and carbon-13 nuclei: Thermal contact between nuclear spins and an electron spin-spin interaction reservoir. Journal of Low Temperature Physics, 1974. 15(3): p. 249-267.
17. Linde, A. J. P., Application of Cross Polarization Techniques to Dynamic Nuclear Polarization Dissolution Experiments, PhD thesis, Sir Peter Mansfield Resonance Centre, The University of Nottingham, November 2009.

18. Jóhannesson, H., et al., Dynamic Nuclear Polarization of [1-$^{13}$C]pyruvic acid at 4.6 tesla, Journal of Magnetic Resonance, 2009. 197, p. 167-175.

19. Jannin, S., et al., A 140 GHz prepolarizer for dissolution dynamic nuclear polarization, The Journal of Chemical Physics, 2008. 128, 241102.

We claim:

1. A method of producing hyperpolarized sample material that is utilized with magnetic resonance investigations, the method comprising the steps of:
   a) disposing a target material within a sample container, the target material containing high γ nuclei having a gyromagnetic ratio $\gamma_{hg}$ with $|\gamma_{hg}/2\pi| \geq 40$ MHz/T, along with a polarizing agent and low γ nuclei having a gyromagnetic ratio $\gamma_{lg}$ with 4.3 MHz/T $\leq |\gamma_{lg}/2\pi| \leq 18$ MHz/T, the high γ nuclei having a short longitudinal relaxation time $T1_{hg}$ and the low γ nuclei having a long longitudinal relaxation time $T1_{lg}$, wherein $T1_{hg} < T1_{lg}$;
   b) placing the sample container with the target material in a magnet, thereby exposing the target material to a static magnetic field $B_0 \geq 4.0$ T generated by that magnet;
   c) placing and keeping the sample container within a cryostat having liquid or gaseous helium, thereby maintaining the target material at a cryogenic temperature Tcr such that the target material is solid before performing step d);
   d) irradiating the polarizing agent in the solid target material with microwave radiation generated by a microwave source, thereby polarizing the high γ nuclei by DNP, wherein an EPR line of the polarizing agent has a width $w_{Pa} > \frac{1}{2} \omega_{hg}$, with $w_{Pa} = 2\sqrt{2\log 2} \cdot \sigma$, $\sigma^2$ being a second moment of the EPR line and $\omega_{hg}$ being a Larmor frequency of the high γ nuclei;
   e) subjecting the solid target material to RF radiation generated by at least one RF coil with two Larmor frequencies, thereby transferring polarization from the high γ nuclei to the low γ nuclei by Cross Polarization, wherein the solid target material is thereby disposed within the at least one RF coil; and
   f) dissolving the solid target material with a dissolution device having solvents, thereby preparing a dissolved sample material from the solid target material, wherein the sample material contains hyperpolarized low γ nuclei.

2. The method of claim 1, wherein the static magnetic field generated by the magnet of step b) is chosen with $B_0 \geq 4.5$ T or $B_0 \geq 6.7$ T.

3. The method of claim 1, wherein the cryogenic temperature Tcr maintained by the cryostat of step c) is chosen with Tcr $\geq 2.2$K or Tcr $\geq 4.2$ K.

4. The method of claim 1, wherein the cryogenic temperature Tcr maintained by the cryostat of step c) is chosen with Tcr $\leq 10$ K.

5. The method of claim 1, wherein the cryogenic temperature Tcr maintained by the cryostat of step c) is chosen with Tcr<2.2 K, Tcr $\leq 1.4$ K or Tcr $\leq 1.2$ K.

6. The method of claim 1, wherein the high γ nuclei and the low γ nuclei disposed within the sample container of step a) are chosen such that $|\gamma_{hg}/\gamma_{lg}| > 3$.

7. The method of claim 1, wherein the high γ nuclei disposed within the sample container of step a) are $^1$H or $^{19}$F.

8. The method of claim 1, wherein the low γ nuclei disposed within the sample container of step a) are $^6$Li, $^{13}$C, $^{15}$N, $^{31}$P or $^{29}$Si.

9. The method of claim 1, wherein the polarization agent of step a) is selected such that $w_{Pa} \geq \omega_{hg}$.

10. The method of claim 1, wherein the polarizing agent of step a) contains nitroxyl radicals.

11. The method of claim 1, wherein the polarizing agent of step a) contains TEMPO or TEMPOL radicals.

12. The method of claim 1, wherein, in step d), the polarizing agent is irradiated by the microwave source until a polarization level of the high γ nuclei has reached at least 75%, at least 90% or at least 95% of a maximum achievable polarization at the static magnetic field $B_0$, at the cryogenic temperature Tcr and for the applied microwave radiation.

13. The method of claim 1, wherein the irradiation by the microwave source in step d) takes 30 minutes or less, 10 minutes or less or 3 minutes or less.

14. The method of claim 1, wherein the long longitudinal relaxation time $T1_{lg}$ of the low γ nuclei disposed within the sample container of step a) is 5 s or longer, 10 s or longer, 30 s or longer or 60 s or longer.

15. The method of claim 1, wherein, for the target material disposed within the sample container of step a), $T1_{hg} \leq \frac{1}{2} T1_{lg}$, $T1_{hg} \leq \frac{1}{5} T1_{lg}$ or $T1_{hg} \leq \frac{1}{10} T1_{lg}$.

16. The method of claim 1, wherein, during irradiation by the RF coil in step e), the target material is kept in the static magnetic field $B_0$ generated by the magnet of step b) at the cryogenic temperature Tcr maintained by the cryostat of step c).

17. The method of claim 1, wherein, during irradiation by the RF coil of step e), the target material is exposed to a static magnetic field lower than $B_0$ generated by the magnet of step b) and/or the target material is at a cryogenic temperature higher than Tcr maintained by the cryostat of step c).

18. The method of claim 1, wherein molecules containing the low γ nuclei undergo a chemical reaction during dissolution of the target material by the dissolution device in step f).

19. The method of claim 1, further comprising the step of subjecting the dissolved sample material containing the hyperpolarized low γ nuclei to a magnetic resonance investigation following dissolution of the target material by the dissolution device in step f).

20. The method of claim 19, wherein the sample container, the magnet, the cryostat, the microwave source, the at least one RF coil and the dissolution device are structured such that the magnetic resonance investigation is an MRI investigation or an MRI of metabolic imaging type.

21. The method of claim 19, wherein the sample container, the magnet, the cryostat, the microwave source, the at least one RF coil and the dissolution device are structured such that the magnetic resonance investigation is an MRS investigation or a localized MRS investigation.

22. A combined dissolution DNP and Cross Polarization device that is utilized with magnetic resonance investigations, the combined device being structured to carry out a method of producing hyperpolarized sample material, the method comprising the steps of:
   a) disposing a target material within a sample container, the target material containing high γ nuclei having a gyromagnetic ratio $\gamma_{hg}$ with $|\gamma_{hg}/2\pi| \geq 40$ MHz/T, along with a polarizing agent and low γ nuclei having a gyromagnetic ratio $\gamma_{lg}$ with 4.3 MHz/T $\leq |\gamma_{lg}/2\pi| \leq 18$ MHz/T, the high γ nuclei having a short longitudinal relaxation time $T1_{hg}$ and the low γ nuclei having a long longitudinal relaxation time $T1_{lg}$, wherein $T1_{hg} < T1_{lg}$;
   b) placing the sample container with the target material in a magnet, thereby exposing the target material to a static magnetic field $B_0 \geq 4.0$ T generated by that magnet;
   c) placing and keeping the sample container within a cryostat having liquid or gaseous helium, thereby maintaining the target material at a cryogenic temperature Tcr such that the target material is solid before performing step d);

d) irradiating the polarizing agent in the solid target material with microwave radiation generated by a microwave source, thereby polarizing the high γ nuclei by DNP, wherein an EPR line of the polarizing agent has a width $w_{Pa} \geq \omega_{hg}$ with $w_{Pa} = 2\sqrt{2\log 2} \cdot \sigma$, $\sigma^2$ being a second moment of the EPR line and $\omega_{hg}$ being a Larmor frequency of the high γ nuclei;

e) subjecting the solid target material to RF radiation generated by at least one RF coil with two coil with two Larmor frequencies, thereby transferring polarization from the high γ nuclei to the low γ nuclei by Cross Polarization, wherein the solid target material is thereby disposed within the at least one RF coil; and f) dissolving the solid target material with a dissolution device having solvents, thereby preparing a dissolved sample material from the solid target material, wherein the sample material contains hyperpolarized low γ nuclei;

the combined device comprising:

a superconducting magnet suitable in generating the static magnetic field $B_0 \geq 4.0$ T of step b);

a cryostat structured in order to accommodate a sample container containing the target material and also maintaining the target material at the cryogenic temperature of step c) by using liquid or gaseous helium;

a microwave enclosure placed within said cryostat and connected to a microwave source via a microwave conduit that exposes the target material to microwave radiation in said microwave enclosure during step d);

at least one RF coil disposed within said cryostat and connected to a Cross Polarization device, wherein said at least one RF coil is structured in order to expose the target material to RF radiation at the Larmor frequencies of the high γ nuclei and of the low γ nuclei during step e); and a plurality of solvent conduits connecting the sample container with the dissolution device of step f), wherein solvent is supplied to and subsequently dissolved sample material removed from the sample container by means of said solvent conduits and controlled by said dissolution device.

23. The combined device of claim 22, wherein said superconducting magnet is suitable for generating a static magnetic field $B_0 \geq 4.5$ T or $B_0 \geq 6.7$ T.

24. The combined device of claim 22, wherein said cryostat is designed for generating a cryogenic temperature in the sample container of Tcr≥2.2 K.

25. The combined device of claim 24, wherein said cryostat is at atmospheric pressure and contains liquid helium at a level above the sample container and further comprising a lambda point refrigerator submersed in the liquid helium and connected to a pump or to a low capacity pump.

26. The combined device of claim 22, wherein said cryostat is designed for generating a cryogenic temperature in the sample container of Tcr≥4.2 K.

27. The combined device of claim 26, wherein said cryostat is at atmospheric pressure and contains liquid helium at a level above the sample container.

28. The combined device of claim 22, wherein said cryostat is designed for generating a cryogenic temperature in the sample container of Tcr<2.2 K, ≤1.4 K or ≤1.2 K.

29. The combined device of claim 28, wherein said cryostat is connected to a pump or to a high capacity pump via a pumping line, said cryostat thereby being below atmospheric pressure and containing liquid helium at a level above the sample container.

* * * * *